United States Patent [19]

Fox et al.

[11] 4,315,072

[45] Feb. 9, 1982

[54] ARTIFICIAL GELATINS OF HIGH METHIONINE CONTENT FOR PHOTOGRAPHIC FILM

[75] Inventors: Sidney W. Fox; Arthur I. Holden, both of Miami, Fla.

[73] Assignee: Polymicro, Miami, Fla.

[21] Appl. No.: 129,351

[22] Filed: Mar. 11, 1980

[51] Int. Cl.$^3$ ..................... G03C 1/06; G03C 1/72; G03F 5/00

[52] U.S. Cl. ..................... 430/628; 430/564; 430/570; 430/607; 430/621; 430/631; 430/640; 106/125

[58] Field of Search ............... 430/628, 564, 640, 570, 430/642, 607, 627, 621, 629, 631, 639; 106/125

[56] References Cited

U.S. PATENT DOCUMENTS

| | | | |
|---|---|---|---|
| 2,710,805 | 6/1955 | Wood | 430/627 |
| 3,052,655 | 9/1962 | Fox | 528/313 |
| 3,076,790 | 2/1963 | Fox | 528/313 |
| 3,312,554 | 4/1967 | Wagner | 430/628 |
| 3,396,030 | 8/1968 | Haas | 430/627 |
| 3,539,353 | 10/1970 | Gates et al. | 430/642 |
| 3,615,624 | 10/1971 | Smith | 430/627 |
| 3,861,918 | 1/1975 | Fitzgerald | 430/628 |
| 4,145,455 | 3/1979 | Fujimaki et al. | 430/642 |

OTHER PUBLICATIONS

Carroll et al., "The Photographic Emulsion; The Silver Ion-Gelatin Equilibrium", J. Res. Nat. Bur. Std., 7:811 (1931).
Lanza et al., J. Electroanalyt. Chem., 12:320 (1966).
Russell, J. Photogr. Sci., 15:151 (1967).

*Primary Examiner*—Mary F. Downey
*Attorney, Agent, or Firm*—Fidelman, Wolffe & Waldron

[57] ABSTRACT

Artificial gelatins containing higher proportions of methionine than are found in natural gelatin are made by thermal polymerization of methionine with various proportions of other α-amino acids, including some proportion of aspartic acid, glutamic acid or lysine. Artificial gelatins containing as much as 40 mole percent methionine can be obtained. Proportions in the polymer can be adjusted by control of proportions in the reaction mixture. Photographic silver halide emulsions containing these artificial gelatins and photographic films employing the emulsions are also disclosed.

8 Claims, 3 Drawing Figures

ARTIFICIAL GELATINS OF HIGH METHIONINE CONTENT FOR PHOTOGRAPHIC FILM

This invention relates to the production and use of artificial gelatins, and in particular artificial gelatins having a high methionine content, in photographic silver halide emulsions. The artificial gelatin may be a polyimide condensation product or a protein polymer derived therefrom. The invention further contemplates photographic films comprising the above-described emulsions.

BACKGROUND OF THE INVENTION

Photographic silver halide materials are normally coated on a transparent film base so that, after processing, light may be passed through the negative image to form a positive image on print paper. Problems in coating the film evenly and uniformly with silver halide materials are regularly encountered. The coating must be even or the material will vary in light sensitivity and show coating marks in the final product. It must also be sufficiently well attached to withstand liquid processing, washing and drying, and yet allow the free entry and chemical action of the developer during processing. To meet these requirements natural gelatin is conventionally used in admixture with the silver halides to form a light sensitive emulsion.

Photographic emulsions are prepared by mixing together two solutions, one containing the dissolved silver ions and the other containing the halide ions. Natural gelatin is mixed with these solutions in order to prevent coalescense of the precipitated silver halide crystallites by adsorbing to the newly formed grains at the time of precipitation and maintaining them in suspension. Natural gelatin is particularly effective in these emulsions because it prevents coalescence yet does not prevent or modify grain growth. Natural gelatin so successfully fulfills the rigid requirements for a photographic emulsion that it is today, more than a century after its first use in photography, the most common emulsion material used in photographic manufacturing.

One of the problems encountered in the use of natural gelatins is the batch-to-batch variation in the properties of identically processed gelatin obtained from different sources or from the same source at different times. These differences give rise to non-uniform photographic products which in turn present significant problems to the photographic processing industry.

A great deal of time and effort has been expended in the search for other suitable binders to overcome the problems inherent in the use of natural gelatin. Attempts to replace natural gelatin with synthetic polymers have so far met with only limited success.

Various researchers have studied the interaction of silver ions with natural gelatin (Carroll and Hubbard, J. Res. Nat. Bur. Std., 7:811 (1931); Lanza and Mazza, J. Electroanalyt. Chem., 12:320 (1966)). All of these authors observed binding of silver by gelating at low pH. This effect has been recently attributed to the presence of methionine groups in the protein. See, for example: Russell, J. Photogr. Sci., 15:151 (1967).

OBJECTS OF THE INVENTION

It is an object of the present invention to provide an artificial gelatin comprising a polyimide condensation product or a protein derived therefrom for inclusion in a photographic emulsion, either partially or totally.

Still another object of this invention is to provide an artificial gelatin containing higher proportions of methionine than are found in natural gelatin.

Another object of the present invention is to provide an artificial gelatin which binds greater amounts of silver ions than natural gelatin and which has silver-binding properties which are uniform from batch-to-batch.

An additional objective is to provide an artificial gelatin which binds silver ion more effectively than does natural gelatin.

It is an object of this invention to make the above described artificial gelatin by thermal polymerization of methionine with various proportions of other α-amino acids, including some proportion of aspartic acid, glutamic acid or lysine.

It is another object of this invention to provide an artificial gelatin which exhibits excellent regellability without significant alterations in final physical/chemical properties and silver-binding properties.

It is another object of the present invention to provide a photographic emulsion containing mixtures of natural gelatin and artificial gelatins.

A primary object of this invention is to provide a photographic emulsion containing an artificial gelatin having a high methionine content relative to natural gelatin.

A further object of the present invention is to provide a photographic emulsion containing an artificial gelatin and any of the conventional ripening, sensitizing, coating, hardening, stabilizing, dyeing and other agents.

Another object of this invention is to provide photographic film containing the emulsions of the invention.

The above-described objects and advantages may be more fully understood by reference to the appended drawings in which.

DETAILED DISCUSSION OF THE INVENTION

THE GELATIN

Figure 1:
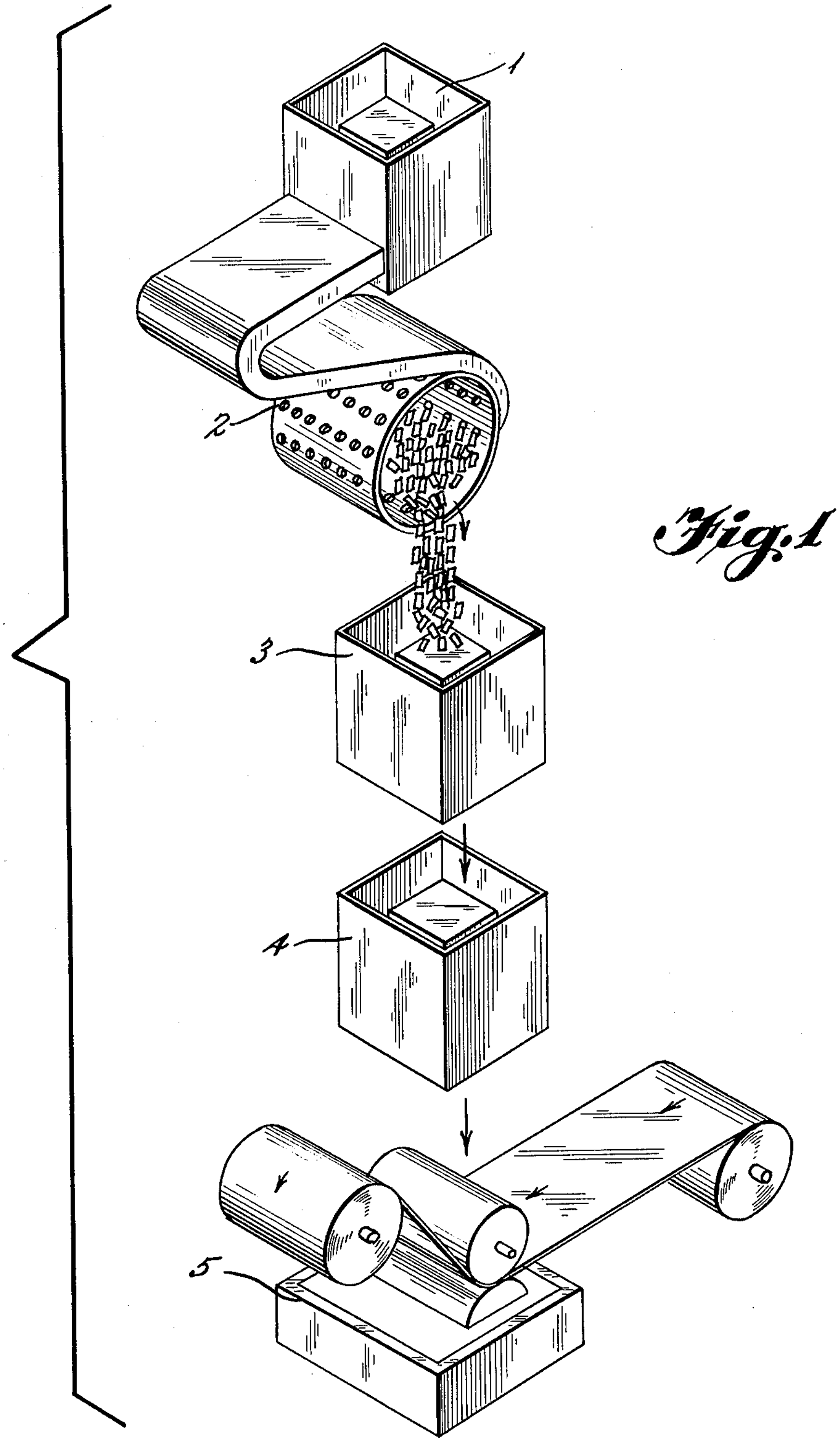
FIG. 1 is a schematic plan for making the photographic film incorporating the emulsion of the invention.

The artificial gelatin utilized in the invention can be made according to the method of U.S. Pat. Nos. 3,052,655 and 3,076,790, which are incorporated herein by reference. It is to be understood that the term "artificial gelatin" as used in this specification includes artificial polyimide condensation products as well as artificial proteins derived from the polyimide products. Briefly the method of making the artificial gelatin comprises heating a mixture of α-amino carboxylic acids at temperatures ranging from about 140° C. to about 210° C. The method may advantageously be conducted in the presence of a sufficient proportion (preferably equimolar) of concentrated (about 85 weight percent or higher) phosphoric acid to facilitate reaction. It is also advantageous to perform the reaction in the presence of an inert atmosphere, such as carbon dioxide or nitrogen. The molecular weight of the condensation polymers may be controlled by regulating the temperature or time of reaction. Typical reaction times are from about 15 minutes to about 25 hours. The addition of an equimolar amount or less of 85 percent or higher phosphoric acid (on an amino acid basis) facilitates reaction so that a lower temperature may be used.

The use of phosphoric acid also promotes the formation of higher molecular weight polymers and usually gives higher yields. However, the reaction is operable in the absence of added phosphoric acid. Also, the prior heating of glutamic acid to form a melt of pyroglutamic acid has been found to expedite the reaction in some cases.

The polyimide condensation polymers produced above are hydrolyzed with an aqueous solution of an alkali metal hydroxide or carbonate (e.g., NaOH, KOH, $Na_2CO_3$, $K_2CO_3$) to give a polypeptide alkali metal salt. The hydrolysis of the polyimide linkages is performed by heating to about 80° C. in the presence of the hydroxide or carbonate for 10 to 15 minutes. The polypeptide salt is then acidified with a mineral acid, preferably to a pH of about 3, to liberate the polypeptide. Alternatively, the imide rings of the polyimide polymer may be opened by dissolving the polyimide in liquid ammonia and allowing the ammonia to evaporate.

It is to be understood that the phrase "polyimide condensation product" as used herein includes polymers having varying proportions of hydrolyzed, or "opened," imide rings.

EXAMPLE I

A quantity of 6.0 g of L-glutamic acid was ground with 2.0 g. of DL-aspartic acid and 2.0 g. of DL-methionine in a mortar. The mixture was heated in an oil bath at 190°-200° C. under nitrogen gas. The mixture melted gradually. After 5 hrs. the heating was terminated and the brown liquid solidified on cooling. To this was added 10 ml. of water with rubbing, whereupon a white to gray solid separated. After overnight standing, the solids were centrifuged and washed with 10 ml. of water and then with 10 ml. of ethanol. The dried polymer gave an intense biuret reaction as did the mother liquor. The solid was dried. A gelatin-like film was deposited. Conducting the reaction under carbon dioxide or preferably nitrogen minimized coloration which appeared mainly at the surface.

Upon analysis, the polymer was found to contain (in molar proportions) 25% aspartic acid, 52% glutamic acid, and 23% methionine. Natural gelatins contain methionine in about 0.4 mole percent.

EXAMPLE II

The synthesis was carried out as in Example I except that the amino acids and proportions heated were: 6.0 g. of glutamic acid, 2.0 g. of methionine, and 2.0 g. of lysine. The proportions in the product were: 66% glutamic acid, 19% methionine, and 16% lysine.

EXAMPLE III

The relative binding of silver ions to natural gelatin and the gelatin product of Example I are compared by the techniques developed by Russell (see above citation). The basic procedure is to carry out measurements of diffusion current changes in the presence of the gelatin of interest. The strongest silver binding, or complexing, is indicated by the largest current decrease upon addition of the gelatin. Before testing all gelatin was lime processed. The natural gelatin used was ossein. Accurately prepared 0.01 Molar silver nitrate was used as the source of silver ions. The ionic strength was maintained at 0.15 by appropriate potassium nitrate addition, after the pH had been adjusted. All measurements were carried out at 30° C.

Figure 3:
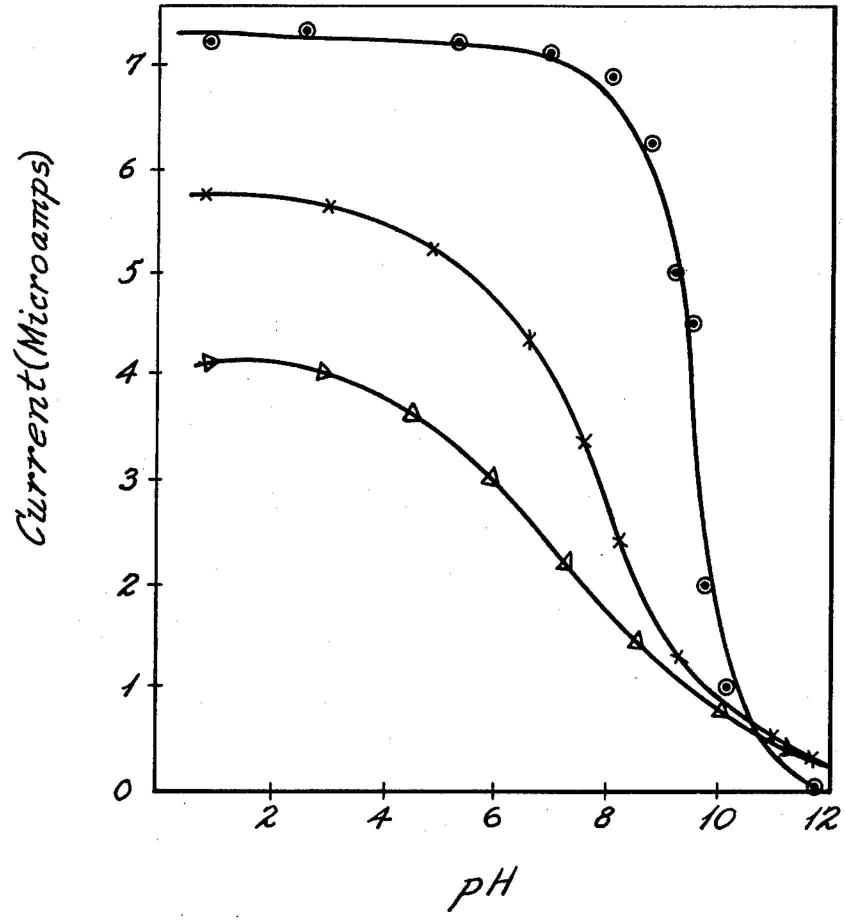
FIG. 3 is a plot of silver diffusion current (microamps) as a function of pH for natural gelatin and an artificial gelatin of the present invention.

Results of silver diffusion current changes as a function of pH are presented in FIG. 3. In the gelatin-free solution (o—o) the current is fairly constant up to pH 7, then there is a large decrease between pH 9 and 10, followed by a leveling out to a very low value at pH 12. These results are consistent with a decrease in silver ions in solution due to precipitation as hydroxide (or hydrated oxide).

In the presence of 2.5 weight percent (dry basis) natural gelatin (x—x) the current is lower than without gelatin, evidencing complexing or binding of the silver ions by the gelatin. When 2.5 weight percent (dry basis) gelatin produced as in Example I is used (Δ—Δ), still further decreases in current are observed indicating that a greater amount of silver ions are bound to the artificial protein than to natural gelatin.

THE EMULSION

The emulsion of the invention may be made according to techniques known in the art. One effective method is illustrated in schematic form in FIG. 1. At step 1 of the figure silver halides are mixed with a warm liquefied artificial gelatin of the invention. The resulting emulsion is ripened by heating for several hours to increase its sensitivity and reduce contrast. In step 2 the emulsion is chilled, shreaded and washed in cold water. Step 3 involves reheating for a second ripening to increase sensitivity. In step 4 while the emulsion is still hot, traces of dyeing agent are added to increase emulsion sensitivity to color. Finally, in step 5 the completed liquid emulsion is coated onto a roll of film substrate which is chilled, dried and cut into various standard sizes.

THE FILM

Figure 2:
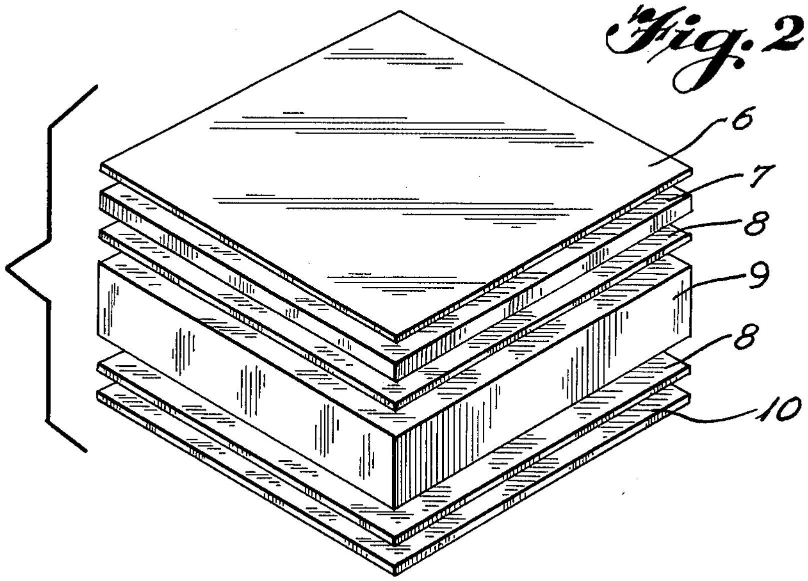
FIG. 2 is a cut-away view of a portion of film incorporating the emulsion of the invention.

Referring now to the film illustrated in FIG. 2, the emulsion 7 is coated on a suitable gelatin and cellulose-coated 8 cellulose triacetate base 9 which is coated on the opposite side with an anticurl layer 10 containing an anti-halation dye. A gelatin supercoat 6 is then applied to the exposed emulsion surface.

EXAMPLE IV

An emulsion was prepared by simultaneous addition of a 3 molar silver nitrate and a 3 molar potassium bromide solution at a rate of 20 ml./min. for 20 min. to an aqueous mixture of 20 g. of the artificial gelatin of Example II. During precipitation the pH was maintained at 7.5, the pAg at 8.2 and the temperature at 65° C. After a physical ripening stage of 5 minutes, the pH was lowered to 3.5 by the addition of diluted sulphuric acid. The coagulum formed after removal of the supernatant liquid was washed twice with water. The coagulum was redispersed by addition of artificial gelatin and water so as to obtain a silver bromide emulsion having per kilogram an amount of silver bromide corresponding to 100 g. of silver nitrate.

This emulsion was coated onto a gelatin and cellulose-coated cellulose triacetate base to provide a photographic film.

What is claimed:

1. A photographic emulsion, comprising a silver halide and a polyimide condensation product of methionine and at least one other α-amino carboxylic acid, wherein the molar percent of methionine is greater than the molar percent of methionine in natural gelatin.

2. The photographic silver halide emulsion of claim 1, wherein the polyimide condensation product comprises methionine in from about 0.5 to 40 mole percent based on the total moles of amino acids.

3. The photographic silver halide emulsion of claim 2, wherein the polyimide condensation product comprises methionine in from about 5 to 25 mole percent based on the total moles of amino acids.

4. The photographic silver halide emulsion of claim 1, wherein the emulsion further comprises at least one member selected from the group consisting of sensitizing, coating, hardening, stabilizing and dyeing agents.

5. The photographic emulsion of claim 1 wherein the polyimide condensation product is further treated to open the imide rings thereof.

6. The photographic silver halide emulsion of claim 5, wherein the protein polymer comprises methionine in from about 0.5 to 40 mole percent based on the total moles of amino acids.

7. The photographic silver halide emulsion of claim 6, wherein the protein polymer comprises methionine in from about 5 to 25 mole percent based on the total moles of amino acids.

8. The photographic silver halide emulsion of claim 5, wherein the emulsion further comprises at least one member selected from the group consisting of sensitizing, coating, hardening, stabilizing and dyeing agents.

* * * * *